(12) United States Patent
Terai et al.

(10) Patent No.: US 9,385,007 B2
(45) Date of Patent: Jul. 5, 2016

(54) SEMICONDUCTOR DEVICE AND METHOD OF MANUFACTURING THE SAME

(75) Inventors: Mamoru Terai, Chiyoda-ku (JP); Shiori Idaka, Chiyoda-ku (JP); Yoshiyuki Nakaki, Chiyoda-ku (JP); Yoshiyuki Suehiro, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/412,847

(22) PCT Filed: Jul. 11, 2012

(86) PCT No.: PCT/JP2012/004472
§ 371 (c)(1),
(2), (4) Date: Jan. 5, 2015

(87) PCT Pub. No.: WO2014/009997
PCT Pub. Date: Jan. 16, 2014

(65) Prior Publication Data
US 2015/0162219 A1    Jun. 11, 2015

(51) Int. Cl.
*H01L 21/56* (2006.01)
*H01L 23/31* (2006.01)
(Continued)

(52) U.S. Cl.
CPC ............... *H01L 21/56* (2013.01); *H01L 21/78* (2013.01); *H01L 23/31* (2013.01); *H01L 23/3107* (2013.01); *H01L 23/3135* (2013.01); *H01L 23/4334* (2013.01); *H01L 23/49503* (2013.01); *H01L 23/49548* (2013.01); *H01L 23/49568* (2013.01); *H01L 23/562* (2013.01); *H01L 24/36* (2013.01); *H01L 24/40* (2013.01); *H01L 29/417* (2013.01); *H01L 2224/32245* (2013.01); *H01L 2224/40137* (2013.01); *H01L 2924/12032* (2013.01); *H01L 2924/12042* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01); *H01L 2924/351* (2013.01)

(58) Field of Classification Search
CPC ......... H01L 21/56; H01L 21/78; H01L 23/31; H01L 23/3107; H01L 23/3135; H01L 23/4334; H01L 23/49503; H01L 23/49548; H01L 23/49568; H01L 23/562; H01L 24/36; H01L 24/40; H01L 29/417
See application file for complete search history.

(56) References Cited

FOREIGN PATENT DOCUMENTS

| JP | 2003 124406 | 4/2003 |
|---|---|---|
| JP | 2004-253678 | 9/2004 |

(Continued)

OTHER PUBLICATIONS

Translation of JP2011228336.*

(Continued)

*Primary Examiner* — Whitney T Moore
(74) *Attorney, Agent, or Firm* — Oblon, McClelland, Maier & Neustadt, L.L.P

(57) ABSTRACT

A plurality of semiconductor elements for power control are formed on a semiconductor substrate. A stress relaxation resin layer covering a crossing region where band-shaped dicing areas dividing the semiconductor elements adjacent to each other cross is formed. The crossing region is diced to cut the stress relaxation resin layer to obtain the separate semiconductor elements. Accordingly, even with semiconductor elements produced with a compound semiconductor substrate of SiC or the like, a semiconductor device having high adhesive strength with a sealing resin and being less likely to cause cracking or peeling of the sealing resin due to thermal stress during an operation can be obtained.

7 Claims, 6 Drawing Sheets

(51) Int. Cl.
*H01L 29/417* (2006.01)
*H01L 21/78* (2006.01)
*H01L 23/433* (2006.01)
*H01L 23/00* (2006.01)
*H01L 23/495* (2006.01)

(56) References Cited

FOREIGN PATENT DOCUMENTS

| JP | 2006 32617 | 2/2006 |
|---|---|---|
| JP | 2006 156863 | 6/2006 |
| JP | 2006 179542 | 7/2006 |
| JP | 2006 318988 | 11/2006 |
| JP | 2011 40611 | 2/2011 |
| JP | 2011 228336 | 11/2011 |

OTHER PUBLICATIONS

Translation of JP2006318988.*
International Search Report Issued Sep. 25, 2012 in PCT/JP12/004472 Filed Jul. 11, 2012.
Office Action issued Mar. 22, 2016 in Japanese Patent Application No. 2014-524496 (with English-language Translation).

* cited by examiner

SEMICONDUCTOR DEVICE AND METHOD OF MANUFACTURING THE SAME

TECHNICAL FIELD

The present invention relates to a semiconductor device having power semiconductor elements used for power control, and a method for manufacturing the same.

BACKGROUND ART

A semiconductor element for power control may also be called a power semiconductor element, and a semiconductor device for power control in which this is used may also be called a power module. The power control semiconductor device has a function of controlling a relatively large current, and is used for a control device for a motor or the like. Power control semiconductor devices currently used include a molding-sealed type in which semiconductor elements are sealed with a thermosetting resin, such as an epoxy resin, and a gel-sealed type in which semiconductor elements are sealed with a gel resin. In particular, the molding-sealed type semiconductor device is widely used for controlling an air-conditioner or the like because of its compactness, excellent reliability and easy handling. In recent years, it is also used for power control for a vehicle in which motor driving is performed.

The molding-sealed type semiconductor device is assembled by first performing die-bonding to adhere semiconductor elements to a frame, and then performing interconnection directly to leads or to corresponding lead parts with wires. The semiconductor elements are obtained by cutting a thin-plate-like crystal wafer into rectangular and separate pieces, and thus they are also called semiconductor chips. After performing interconnection, molding sealing is carried out with a sealing resin, such as an epoxy resin, by a technique such as transfer molding or potting. In the above-described semiconductor device, thermal stress resulting from the difference in thermal expansion coefficient between the semiconductor chips and the sealing resin (molding resin) or shrinkage on curing of the sealing resin is produced in the semiconductor chips. Since intermittent current application to the semiconductor elements is repeated in the operation of the semiconductor device, the semiconductor elements repeat the temperature cycle of temperature rise and temperature drop every time electric current is applied. Therefore, if a defect is brought about by the above-described thermal stress in the adhesion interface between the sealing resin and the semiconductor chips to cause peeling or microcracking of resin, reliability might be degraded due to degradation in withstand voltage, variation in characteristics of the elements, or the like. Even if peeling is not brought about, deformation of interconnection lines or breakage of the semiconductor chips may occur. Since the above-described thermal stress is maximized at the end of each semiconductor chip, peeling of resin originates in many cases from the end of each semiconductor chip.

In a conventional semiconductor device, a polyamide resin is applied to the whole surface of an assembly associated with interconnection, including a heat sink, semiconductor chips, an electrode block, and the like to thereby increase adhesion with a sealing resin (see e.g., Patent Document 1).

Similarly, the surface of an assembly (housing component) is covered thinly with a polyimide- or polyamide imide-based covering resin, and a sealing resin is charged thereon and cured so as to improve the resistance to temperature cycle and moisture resistance (see e.g., Patent Document 2).

CITATION LIST

Patent Document

PTD 1: Japanese Patent Laying-Open No. 2003-124406
PTD 2: Japanese Patent Laying-Open No. 2006-32617

SUMMARY OF INVENTION

Technical Problem

In the conventional semiconductor device, the assembly in which die bonding, interconnection and the like have been completed is covered with a resin layer. It is therefore difficult to make the thickness of the resin layer uniform at the surface of the assembly having a complicated shape. For example, an attempt to apply the resin layer thinly such that the thickness is smaller than or equal to 10 μm can result in a partially thick portion or a region to which the resin layer has not been applied. Due to the unevenness of the resin layer, the effect of relaxing thermal stress is not exerted, and temperature cycle histories are accumulated, resulting in peeling of a molding resin.

The present invention was made to solve the problems as described above, and has an object to obtain a semiconductor device having excellent reliability of adhesion between a molding resin and semiconductor elements, as well as a method of manufacturing the semiconductor device.

Solution to Problem

A method of manufacturing a semiconductor device according to the present invention includes the steps of forming a plurality of semiconductor elements on a semiconductor substrate, forming a resin layer covering the semiconductor substrate in a crossing region where band-shaped dicing areas dividing the semiconductor elements adjacent to each other cross, dicing the crossing region to cut the resin layer, dicing the dicing areas between the resin layers, interconnecting the semiconductor elements separated by dicing, and sealing the semiconductor elements as interconnected with a thermosetting resin.

Advantageous Effects of Invention

Since the stress relaxation resin layers are formed at the four corners of each element, peeling caused by thermal stress brought about by a temperature cycle during an operation is restrained, so that a semiconductor device having excellent reliability of adhesion between a molding resin and semiconductor elements can be obtained.

DESCRIPTION OF EMBODIMENTS

First Embodiment

Figure 1:
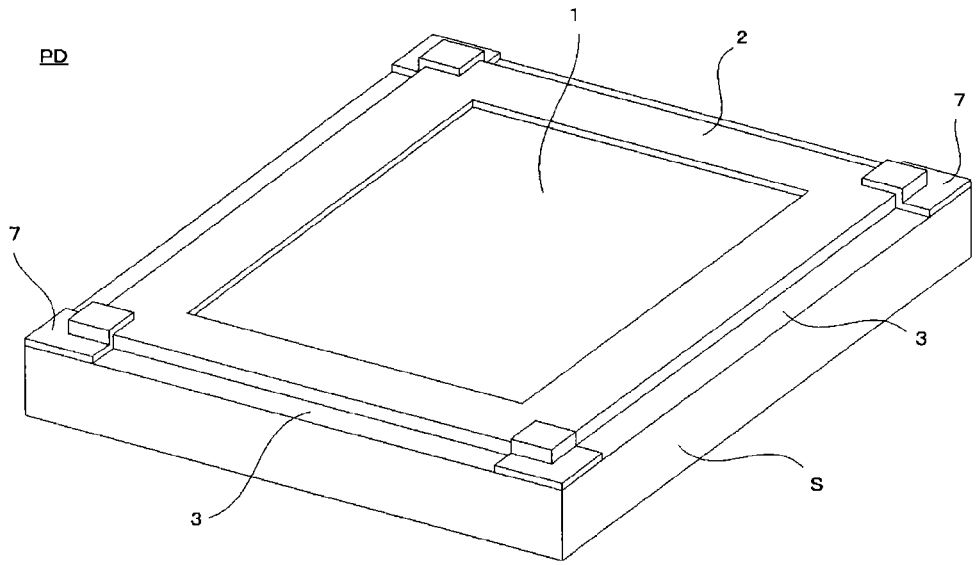
FIG. 1 is a perspective view of a semiconductor element in a semiconductor device according to a first embodiment of the present invention.

FIG. 1 is a perspective view of a power control semiconductor element PD in a power control semiconductor device according to a first embodiment of the present invention, and schematically shows the structure on the upper surface side of semiconductor element PD. After formation on a semiconductor substrate in the wafer form, semiconductor elements PD are diced from the semiconductor substrate into rectangular separate pieces. In FIG. 1, a main electrode 1 formed on a semiconductor substrate S serves as the path of a principal current with which power control by semiconductor element PD is performed. Formed on the rear surface side of semiconductor element PD is a rear electrode having a polarity different from that of main electrode 1. In order to ensure the withstand voltage between the rear electrode and main electrode 1, an insulating resin layer 2 covering the outer peripheral edge of main electrode 1 is formed. Insulating resin layer 2 is made of a heat-resistant resin material, such as polyimide or polyamide. Formed in the four corner regions constituting part of the outermost periphery of the surface of semiconductor substrate S are stress relaxation resin layers 7. Stress relaxation resin layers 7 may partially cover insulating resin layer 2.

Figure 2:
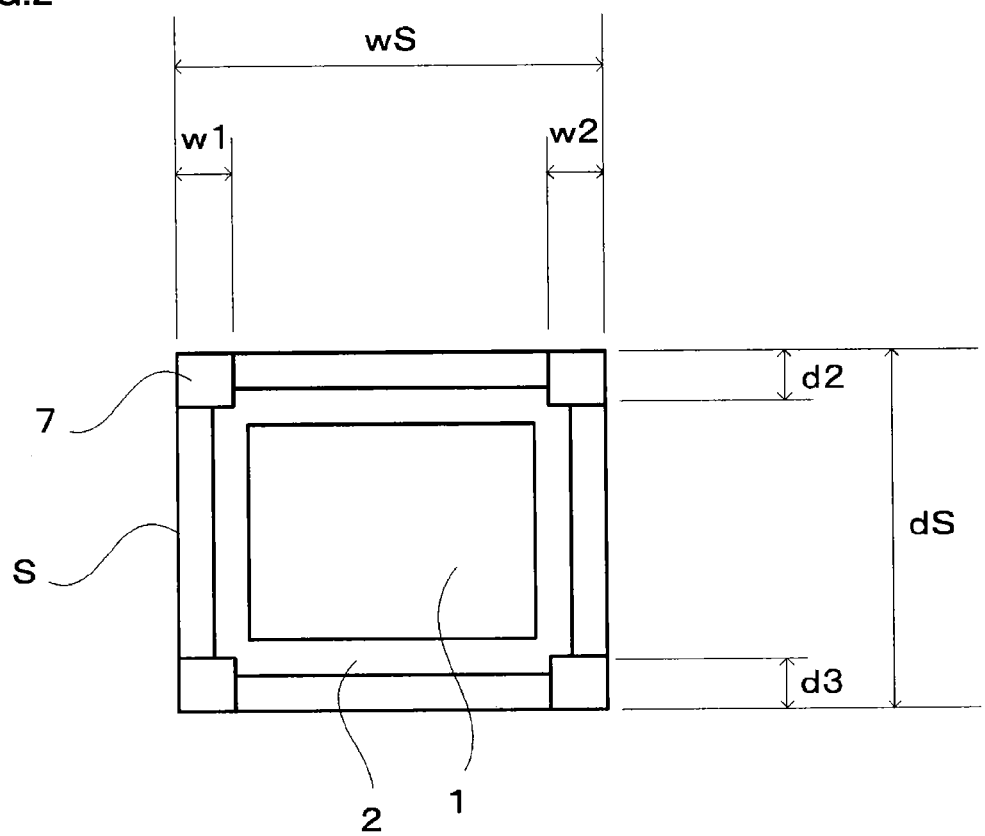
FIG. 2 is a plan view of the semiconductor element in the semiconductor device according to the first embodiment of the present invention.

FIG. 2 is a plan view of a semiconductor element in the semiconductor device according to the first embodiment. In order to prevent clogging of a blade during dicing, insulating resin layer 2 is formed avoiding a dicing area in the wafer state. Therefore, the outer peripheral side of insulating resin layer 2 does not reach the end of semiconductor substrate S, so that four-side-neighboring regions on semiconductor substrate S are uncovered. On the other hand, in the four corner regions where stress relaxation resin layers 7 are formed, the surface of the end of semiconductor substrate S is covered. In order to improve productivity, it is desirable to form a coating of stress relaxation resin layers 7 collectively on the group of elements formed in the wafer before dicing semiconductor elements PD from the wafer.

However, when collective formation as described above is performed, the following problems will arise. Generally, when cutting a wafer with a soft layer such as resin formed thereon, the soft layer forming substance will adhere to and accumulate on a dicing blade, causing clogging of the blade. Clogging of the blade results in decreased cutting stress, which may cause small cracks called chipping in elements. When cutting stress relaxation resin layers 7, it is required that the total value of widths w1 and w2 of two stress relaxation resin layers 7 on one side be smaller than or equal to 5% of a length wS of one side of semiconductor substrate S per element in order to prevent clogging of the blade. Within this range, stress relaxation resin layers 7 will be interspersed on a dicing line and have a ratio small enough relative to a certain dicing length. Thus, self-cleaning of the blade becomes possible in the course of dicing, which practically solves the problem of clogging. It is considered that the self-cleaning effect is produced by scraps of a ground substrate entering in between grindstones to discharge resin.

In addition, in order to achieve a stress relaxation effect on thermal stress produced by a sealing resin, stress relaxation resin layer 7 needs to have a width of more than or equal to 0.73% of length wS of a side. These numerical examples will be described later.

Referring to FIG. 2, the above-described conditions are expressed below:

$$0.05wS \geq w1+w2$$

$$w1 \geq 0.00365wS$$

$$w2 \geq 0.00365wS \quad \text{(Expression 1)}$$

Similarly, $$0.05dS \geq d2+d3$$

$$d1 \geq 0.00365dS$$

$$d2 \geq 0.00365dS \quad \text{(Expression 2)}$$

Semiconductor element PD is bonded to a current-carrying member, such as a frame, and a lead member is bonded to main electrode 1, thereby constituting a frame assembly. The frame assembly is sealed with a thermosetting sealing resin made of an epoxy resin or the like.

Figure 3:
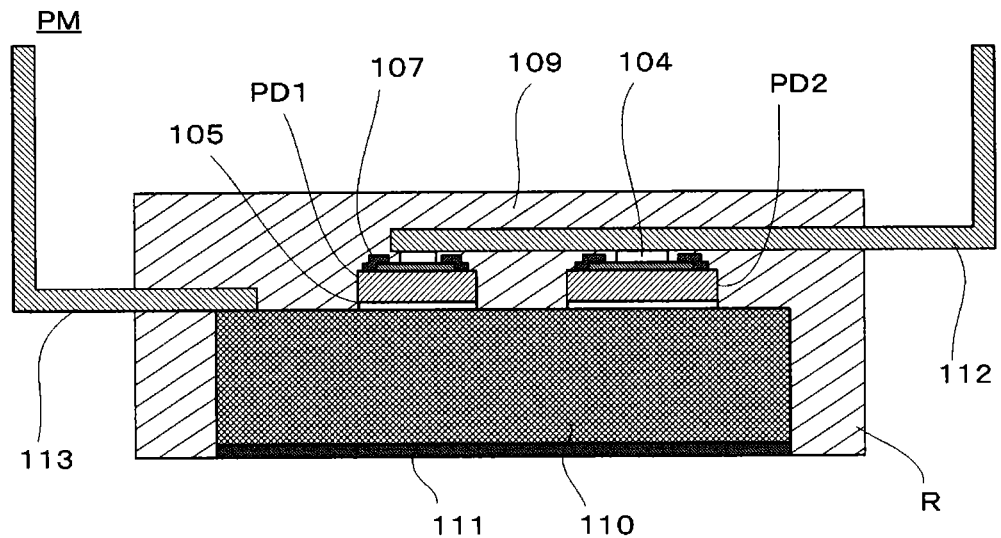
FIG. 3 is a sectional view showing an example structure of the semiconductor device according to the first embodiment of the present invention.

FIG. 3 is a sectional view showing an example structure of the semiconductor device according to the first embodiment of the present invention, in which two power semiconductor elements PD1 and PD2 are connected in parallel. Semiconductor elements PD1 and PD2 have a surface structure similar to that of FIGS. 1 and 2, whose main electrodes are connected to a lead member 112 with a bonding material 104 interposed therebetween. On the rear surface side of semiconductor elements PD1 and PD2, rear electrodes not shown are bonded to a heat spreader 110 also serving as a current-carrying member with a bonding material 105 interposed therebetween. These assemblies are sealed with a molding resin R to constitute the semiconductor device. It is noted that an insulating sheet 111 made of an insulating member may be attached to the rear surface of heat spreader 110 to achieve insulation of heat spreader 110. Heat spreader 110 is connected to a lead member 113 and supplied with current. Unsealed portions of lead members 112 and 113 will be external terminals and serve as leads to be connected to an external circuit.

It is known that a semiconductor element produced through use of a semiconductor substrate made of SiC (silicon carbide), GaN (gallium nitride) or the like having a band gap greater than that of Si (silicon) has an extremely high upper limit of an operating temperature compared with a Si semiconductor element. For example, a power module with SiC semiconductor chips mounted thereon is also used at such a high temperature that the temperature of the semiconductor chips during an operation exceeds 150° C., and may also be used in the state of 200° C., for example. When the operating temperature of the semiconductor chips is raised, the difference in temperature from the normal temperature increases. Thus, thermal stress in the adhesion interface with the sealing resin increases further, so that degradation of the adhesion interface is likely to be remarkable.

An electroforming blade with diamond particles, cubic boron nitride, or the like used as abrasive grains is usually used for cutting a semiconductor wafer including the case of Si. In the case of a SiC semiconductor substrate, a high concentration blade having such an abrasive grain density that a volume ratio occupying an abrasive grain layer exceeds 20% is desirable since SiC is very hard. However, due to the high degree of concentration of abrasive grains, clogging is likely to occur when cutting a resin layer. The use of a clogged blade will problematically cause chipping or blade damage frequently.

Figure 4:
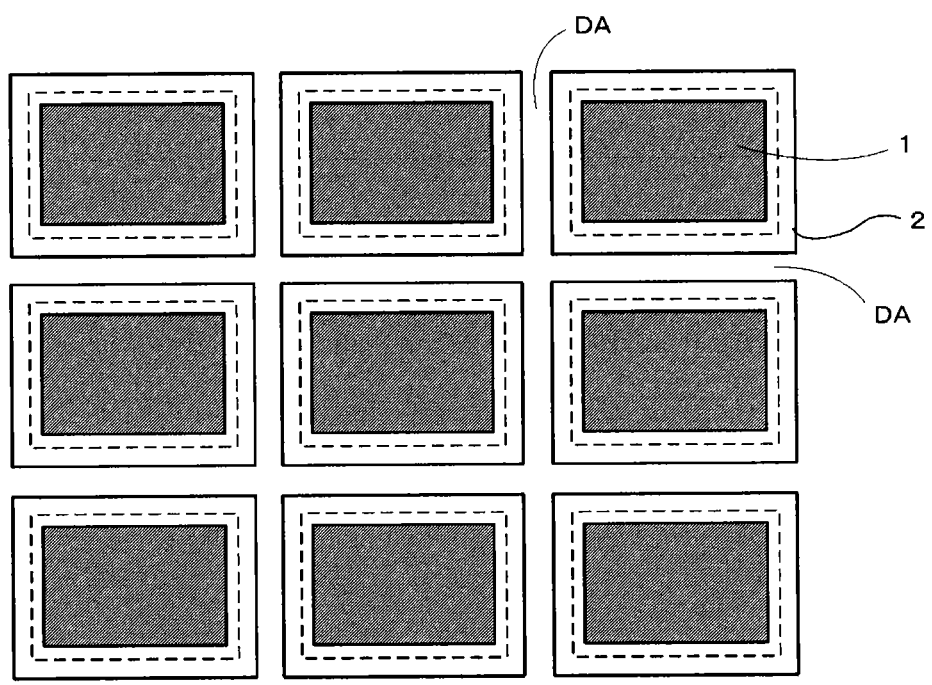
FIG. 4 is a plan view showing an example of a semiconductor substrate.

Next, a method of forming stress relaxation resin layers will be described. FIG. 4 is a plan view showing an example of a semiconductor substrate before stress relaxation resin layers 7 are formed. A plurality of main electrodes 1 are arranged in a matrix form at regular intervals, and insulating resin layer 2 is arranged to cover an outer peripheral edge 4 of each main electrode 1. Insulating resin layer 2 has a rectangular frame-like shape, and stress relaxation resin layers 7 are formed to cover the four corners thereof. A pattern for insulating resin layer 2 is made by a photolithography step after covering the front surface thereof. In the case where a guard ring surrounding the periphery of main electrode 1 is formed, insulating resin layer 2 also covers the guard ring. A polyimide resin excellent in insulation or the like is used for insulating resin layer 2. Between insulating resin layers 2, there are regions extending vertically and horizontally in the form of band where dicing is possible, which hereinafter will be referred to as dicing areas DA.

Figure 5:
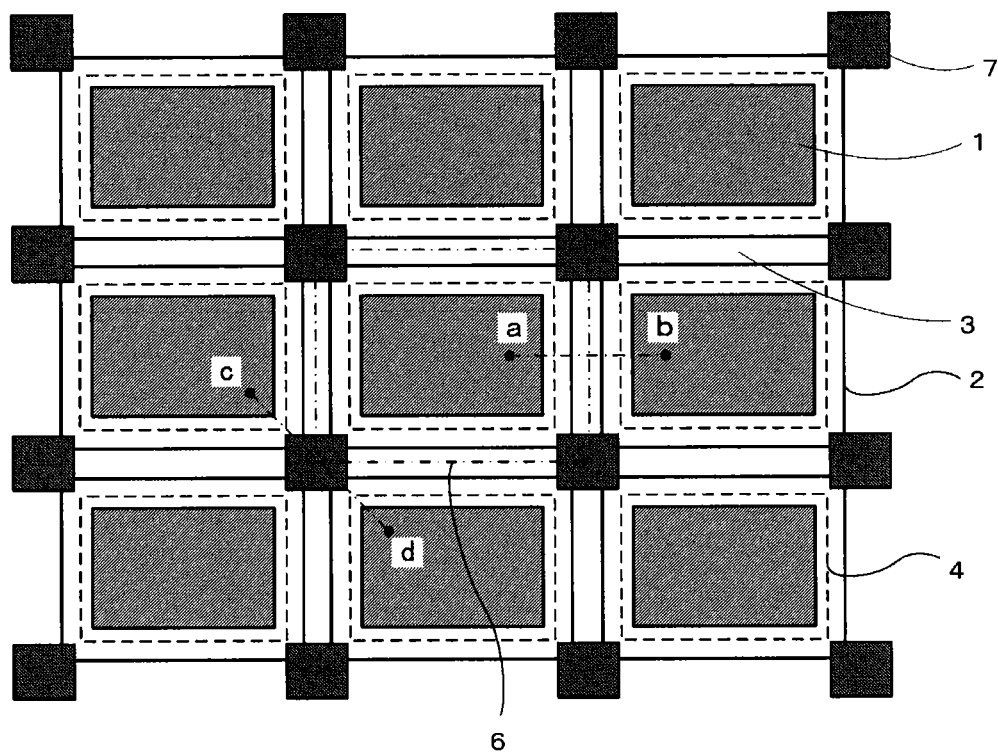
FIG. 5 is a plan view showing a first manufacturing method for semiconductor elements according to the first embodiment of the present invention.

FIG. 5 is a plan view showing a first manufacturing method for semiconductor elements according to the first embodiment, and shows the surface structure of semiconductor substrate S before dicing. In the structure of FIG. 5, each region where above-described dicing areas DA cross each other is covered individually by stress relaxation resin layer 7, and each of stress relaxation resin layers 7 is arranged to occupy one of the four corners of semiconductor elements adjacent to each other. Between adjacent stress relaxation resin layers 7, substrate surface 3 is uncovered. Therefore, when dicing is performed vertically and horizontally in FIG. 5, the crossing regions covered by stress relaxation resin layers 7 and regions not covered by stress relaxation resin layers 7 will be alternately cut as a dicing blade moves at a constant speed. It is noted that a thin film or the like having no influence on dicing may be formed in the region of substrate surface 3. The alternate long and short dash line indicates the virtual position of a cut section 6 after dicing.

Figure 6:
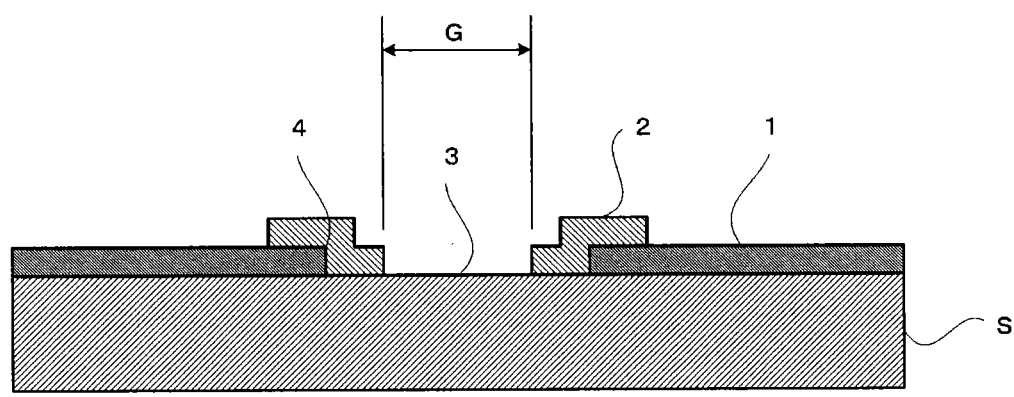
FIG. 6 is a sectional view showing the first manufacturing method for the semiconductor element according to the first embodiment of the present invention.

FIG. 6 is a sectional view showing the manufacturing method for the semiconductor element according to the first embodiment, and schematically shows a cut section taken along a line segment ab in FIG. 5. Insulating resin layer 2 is formed to cover outer peripheral edge 4 of main electrode 1. Insulating resin layer 2 is once applied to the whole surface of semiconductor substrate S after main electrode 1 is formed, and then formed into a frame shape by a photolithography technique.

As the method of applying the insulating resin layer, spin coating, spray coating or the like can be used. The formed pattern is formed to cover main electrode 1 and the guard ring surrounding main electrode 1.

Figure 7:
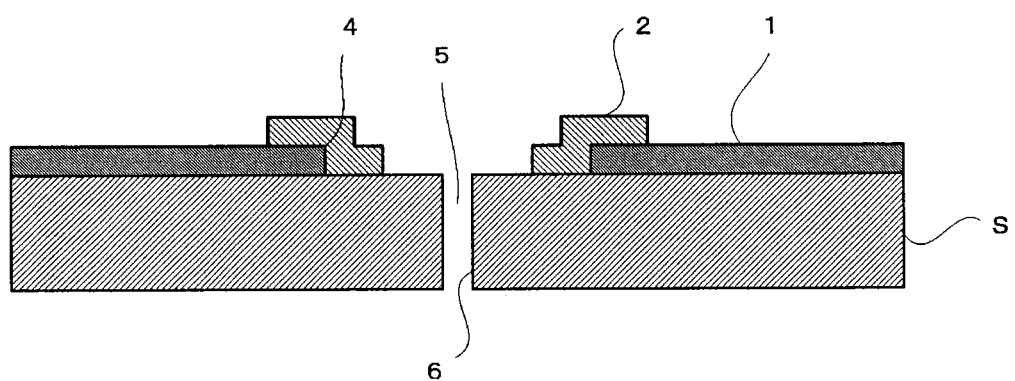
FIG. 7 is a sectional view showing the first manufacturing method for the semiconductor element according to the first embodiment of the present invention.

A gap G is the distance between insulating resin layers 2 adjacent to each other, and is practically 50 to 200 μm. Gap G is substantially the width of a region where dicing is possible. FIG. 7 is a sectional view showing the first manufacturing method for the semiconductor element according to the first embodiment, and schematically shows the state where dicing has been performed at the section of FIG. 6. In the dicing step, semiconductor substrate S is cut per semiconductor element PD, and dicing trench 5 is formed for separation.

The width of dicing trench 5 differs among dicing methods. Cut section 6 produced by dicing is an outer peripheral edge of semiconductor element PD.

Figure 8:
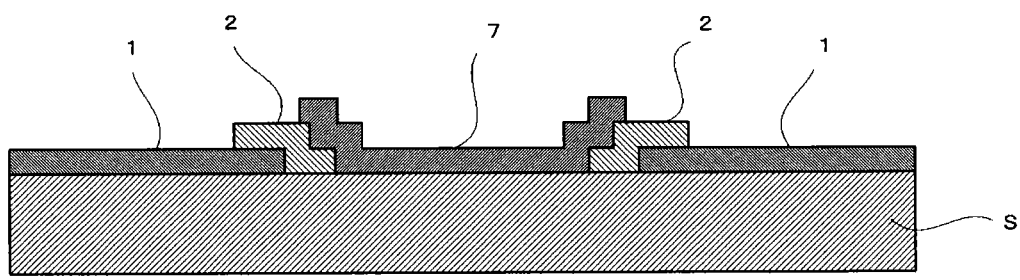
FIG. 8 is a sectional view showing the manufacturing method for the semiconductor element according to the first embodiment of the present invention.

FIG. 8 is a sectional view showing the first manufacturing method for the semiconductor element according to the first embodiment, and schematically shows the cut section taken along a line segment cd in FIG. 5. Stress relaxation resin layer 7 continuously covers the surface of semiconductor substrate S between insulating resin layers 2 from above the ends of insulating resin layers 2.

Stress relaxation resin layer 7 is applied to the whole surface of semiconductor substrate S after insulating resin layer 2 is formed, and then formed into a frame shape by a photolithography technique. If a material having photosensitivity is used for stress relaxation resin layer 7, it is possible to directly pattern stress relaxation resin layer 7. If stress relaxation resin layer 7 is non-photosensitive, it is separately subjected to steps of resist application, exposure development, etching, and resist removal to be processed into a desired pattern.

Stress relaxation resin layer 7 may be of an identical material to the insulating resin layer, however, a resin having a withstand voltage lower than that of the insulating resin layer is applicable. Thus, polyimide, a polyamide-based resin, an acrylic resin, a silicone resin, a silsesquioxane-based resin, a silanol-based resin, or the like can be used.

In the dicing step, stress relaxation resin layer 7 is cut, so that divided stress relaxation resin layers 7 cover the four corners of the surface of semiconductor element PD.

The insulating resin layer is not particularly limited as long as it has a desired dielectric strength, however, polyimide, a high-voltage acrylic resin or the like is used.

Stress relaxation resin layer 7 may be of an identical material to the insulating resin layer, however, even a material which is not suitable as the insulating resin layer may also be used because resin having a dielectric strength lower than the insulating resin layer is applicable. For example, polyimide, a polyamide-based resin, an acrylic resin, a silicone resin, a silsesquioxane-based resin, a silanol-based resin, or the like can be used for stress relaxation resin layer 7. Alternatively, as the resin used for the stress relaxation resin layer, a mixture of a plurality of resins or a resin adjusted in elastic modulus by adding a filler thereto can also be used.

If the film thickness of stress relaxation resin layer 7 exceeds a certain thickness, clogging of the dicing blade will arise to cause chipping or cracking even if the method of the present embodiment is used. Therefore, the film thickness of stress relaxation resin layer 7 needs to be less than or equal to 15 μm, and desirably less than or equal to 3 μm.

The coefficient of linear expansion of each member constituting a circuit board is 3 to 5 ppm/K in the case of a semiconductor element in which SiC is used for the substrate, 17 ppm/K if a terminal member or an interconnection member is made of copper, and 23 ppm/K in the case of aluminum. In order to efficiently radiate heat generated by semiconductor elements, an insulating sheet has improved thermal conductivity by filling resin such as epoxy with an inorganic-powder filler having excellent thermal conductivity at a high filling rate of about 70 vol %, and has a coefficient of linear expansion reduced to about 10 to 200 ppm.

An insulating filler is suitably used as a filler charged into a sealing resin or a covering resin. As the insulating filler, inorganic powder having a small coefficient of linear expansion, such as fused silica, alumina having excellent thermal conductivity or the like is used. Besides, crystalline silica, glass, boron nitride, aluminum nitride, silicon carbide, natural mineral-based material, or the like can be used. A combination of several types of fillers may be used since the range of particle diameter and shape can be selected depending on required application, such as coloring, viscosity adjustment, lubrication, or the like.

A wire-shaped or plate-shaped lead member is used, and a member made of aluminum or copper having high conductivity is suitable.

In the semiconductor device having the structure as described above as sealed with a sealing resin, stress relaxation resin layers 7 are placed at the interface at the four corners where the maximum thermal stress is applied to semiconductor element PD. Therefore, peeling or cracking of the sealing resin and the semiconductor elements resulting from heat generated during an operation or reliability evaluation can be restrained. Accordingly, the insulation performance of semiconductor element PD is maintained, while the surface of semiconductor element PD is protected, so that the semiconductor device having excellent reliability can be obtained.

Second Embodiment

Figure 9:
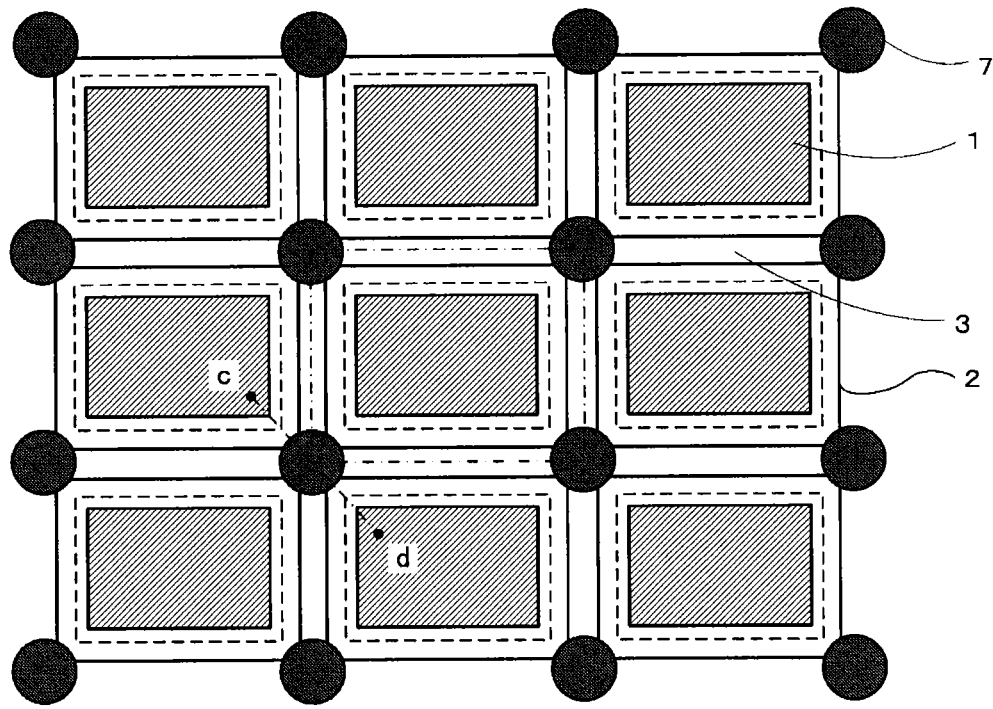
FIG. 9 is a plan view showing a manufacturing method for semiconductor elements according to a second embodiment of the present invention.

FIG. 9 is a plan view showing a manufacturing method for semiconductor elements according to a second embodiment of the present invention. As shown in FIG. 9, stress relaxation resin layers 7 formed in the crossing regions of dicing areas DA differ from those of the first embodiment in that they are circular. Although this structure can be achieved by the method of the first embodiment, it is presupposed here that stress relaxation resin layers 7 are implemented by means of a dispensing method, electrostatic coating, ink jet, or the like, rather than photolithography. With these forming methods, it is difficult to form a shape such as quadrangle, but they are suitable methods for forming a generally circular pattern. By means of these forming methods, the amount of used resin can be reduced, and cost increase can be suppressed.

Figure 10:
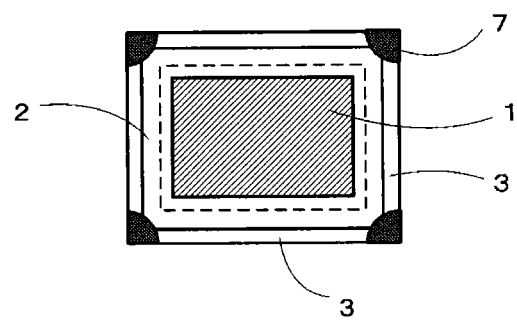
FIG. 10 is a plan view showing the semiconductor element according to the second embodiment of the present invention.

FIG. 10 is a plan view showing the semiconductor element according to the second embodiment. Fan-shaped stress relaxation resin layers 7 are arranged at the four corners of semiconductor element PD. Even if stress relaxation resin layers 7 are generally circular, the four corner regions of semiconductor element PD after dicing can be covered. Therefore, a semiconductor device having excellent productivity can be obtained through use of these simple and relatively inexpensive processes.

It is noted that the method of forming relaxation resin layers 7 is not particularly limited as long as a pattern can be formed at a desired place.

Peeling or cracking of the sealing resin and the semiconductor elements is restrained by stress relaxation resin layer 7, so that a semiconductor device having excellent reliability can be obtained.

Third Embodiment

Figure 11:
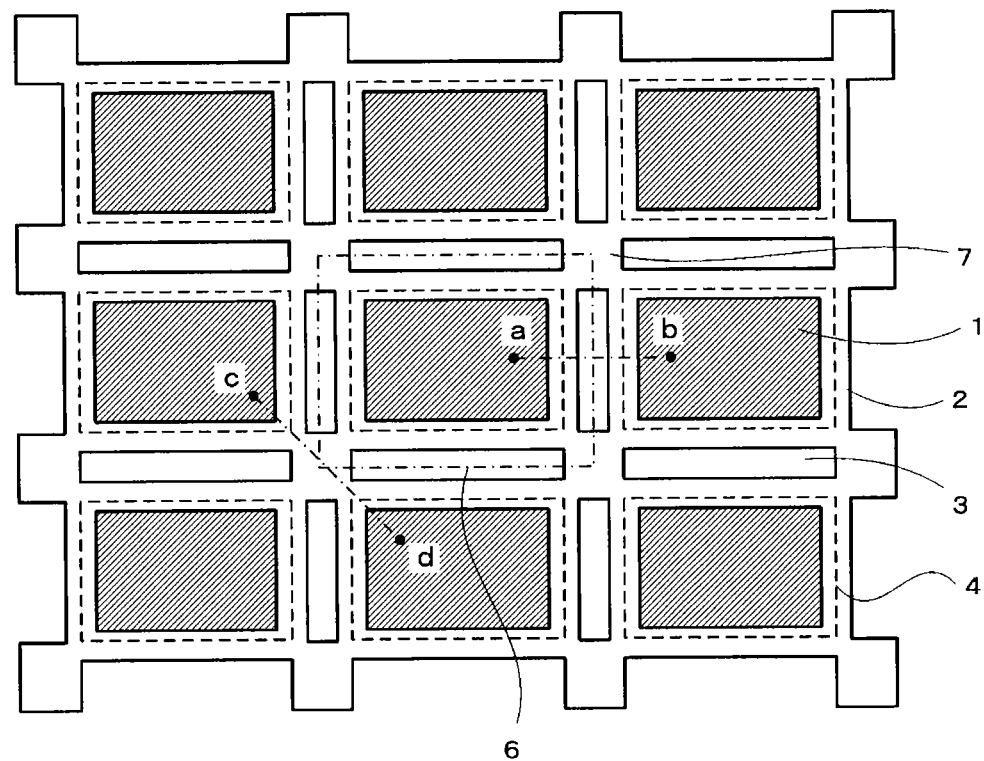
FIG. 11 is a plan view showing a manufacturing method for semiconductor elements according to a third embodiment of the present invention.

FIG. 11 is a plan view showing a manufacturing method for semiconductor elements according to a third embodiment. Resin serving both as the insulating resin layer and the stress relaxation resin layer is used for the semiconductor substrate before dicing, and the pattern of FIG. 11 is formed by a photolithography step. Since stress relaxation resin layer 7 also serves as insulating resin layer 2 on the guard ring, the insulating resin layer and the stress relaxation resin layer can be formed collectively at the same time.

Figure 12:
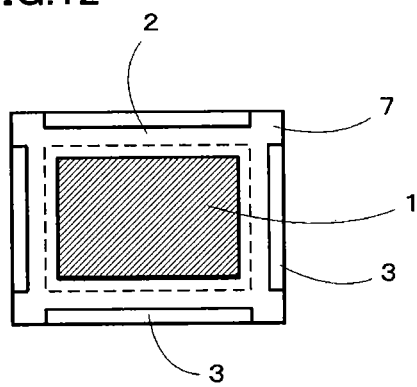
FIG. 12 is a plan view showing a semiconductor element according to the third embodiment of the present invention.

FIG. 12 is a plan view showing a semiconductor element according to the third embodiment. As a result of dicing, semiconductor element PD can be obtained whose four corners are covered by a continuous stress relaxation resin layer of an identical material to the insulating resin layer. Peeling or cracking of the sealing resin and the semiconductor element is restrained by stress relaxation resin layer 7, so that a semiconductor device having excellent reliability can be obtained.

By skipping the step of independently forming stress relaxation resin layer 7, the process becomes more simple and inexpensive. Therefore, a semiconductor device having excellent productivity can be obtained.

It is noted that dicing is typically performed by a method of mechanically cutting with a dicing blade, however, a method of using a dicing blade and ultrasonic waves in combination, laser dicing with laser, or the like can be used. In laser dicing, it is also useful to use a stress relaxation resin layer limited at the four corners of a semiconductor chip in a technique of polycrystallizing the inside of semiconductor substrate S with laser beams. That is, this is because linear crack progress can be achieved when applying external force since most of the regions in the dicing area can be irradiated with laser beams by defining the width of the stress relaxation resin layer in an extremely limited manner. In addition, after polycrystallizing a scribe region with laser, the stress relaxation resin layer may be formed, and the semiconductor chip may be divided by external force or thermal stress. In this case, dicing can be performed efficiently since chip division progresses smoothly by limiting the width of the stress relaxation resin layer.

EXAMPLES

A semiconductor device through use of the structure of semiconductor device PM shown in FIG. 3 was produced, and reliability evaluation thereof was performed. In semiconductor device PM, heat spreader 110 and a semiconductor element, and a semiconductor element are bonded with solder, a sintering silver particulate material or the like used as a bonding material. Herein, production was performed through use of sintering silver particulates. An insulating sheet with a metallic foil attached to the rear surface was bonded to the other side surface of the heat spreader.

For the semiconductor element, a switching element such as IGBT (Insulated Gate Bipolar Transistor) or MOSFET (Metal Oxide Semiconductor Field Effect Transistor), or a rectifier element such as a Schottky barrier diode is used, for example. In the case of using MOSFET, a source electrode, a gate electrode and a guard ring are formed on the lead member side. A drain electrode is formed on the heat spreader side. The lead member which conducts a principal current is bonded to the source electrode. The lead member may be a metallic wire or a metallic ribbon. MOSFET produced with a SiC substrate used as a base, a copper thin-plate lead member and a copper heat spreader were used here.

Resin sealing is performed in such a manner that the end of the lead member (an outer lead portion) and a metallic foil portion of the insulating sheet to be a heat radiating surface are uncovered. Herein, sealing was performed by transfer molding with an epoxy resin having a filler distributed therein. In the semiconductor element, an insulating resin layer covering a guard ring part and stress relaxation resin layers in the four corner regions on the outside of the guard ring were formed. Non-photosensitive polyimide (PIX3400 available from HD MicroSystems, Ltd.) was used for the insulating resin layer, and photosensitive polyimide (HD8930 available from HD MicroSystems, Ltd.) was used for the stress relaxation resin layers.

The specifications of semiconductor elements produced with parameters shown in FIG. 3 are shown in Tables 1 and 2. Since a square MOSFET was used for the semiconductor element, the relationship of wS=dS holds. For the stress relaxation resin layer, w1+w2=d2+d3 holds.

A coverage factor X is defined by the following expression:

$$X=(w1+w2)/wS \qquad \text{(Expression 3)}$$

Although it is designed to satisfy w1=w2, a dimensional deviation within several micrometers in consideration of misalignment in dicing or the like was permitted.

For reliability evaluation of each semiconductor device, a heat cycle test and a power cycle test were carried out. The heat cycle test was carried out by placing the entire semiconductor device into an isothermal bath whose temperature was controllable, and repeatedly varying the temperature of the isothermal bath between −60° C. and 180° C. The power cycle test was carried out by applying electric current until the temperature of each semiconductor element reached 200° C., stopping current application when the temperature arrived, cooling the semiconductor element until the temperature reached 120° C., and after being cooled, applying electric current again.

Tables 1 and 2 show the number of cycles resulting in peeling between a semiconductor element and a molding resin by each test as well as the presence/absence of cracks after the test.

Comparative Example 1 in Table 1 is a semiconductor element of a specification to which stress relaxation resin layers are not formed in a semiconductor element having a length of 5.5 mm on each side, and shows that peeling of the molding resin was observed after 50 k cycles (50,000 cycles) of the power cycle test. In the heat cycle, peeling was observed in 300 cycles from the initial stage. In contrast, in Examples 1 to 5, the number of cycles resulting in peeling increased by forming stress relaxation resin layers. In Examples 2 to 4 each having a coverage factor X of more than or equal to 0.73%, elements exceeding 200 k cycles in the power cycle test and 1.8 k cycles in the heat cycle test, which are considered as practical values of durability, were obtained.

In Example 4 having a coverage factor X of 5%, slight microcracks were produced at the ends of each semiconductor element in the blade dicing step, and in Example 5 having a coverage factor X of 7.27%, many microcracks were produced. From a practical viewpoint, the upper limit of coverage factor X was determined to be 5%.

Comparative Example 1 in Table 2 is a semiconductor element of a specification to which stress relaxation resin layers are not formed in a semiconductor element having a length of 12 mm on each side, and shows that peeling of the molding resin was observed after 20 k cycles (20,000 cycles) of the power cycle test. In the heat cycle, peeling was observed in 50 cycles from the initial stage. In contrast, in Examples 6 to 10, the number of cycles resulting in peeling increased by forming stress relaxation resin layers. In Examples 8 and 9 each having a coverage factor X of more than or equal to 0.71%, elements exceeding 200 k cycles in

TABLE 1

|  | Comparative Example 1 | Example 1 | Example 2 | Example 3 | Example 4 | Example 5 |
|---|---|---|---|---|---|---|
| wS (μm) | 5500 | 5500 | 5500 | 5500 | 5500 | 5500 |
| w1 + w2 (μm) | 0 | 20 | 40 | 100 | 275 | 400 |
| X (%) | 0 | 0.36 | 0.73 | 1.82 | 5.00 | 7.27 |
| Power Cycle (the number of cycles resulting in peeling) | 50k | 80k | >200k | >200k | >200k | 180k |
| Heat Cycle (the number of cycles resulting in peeling) | 0-300 | 100-500 | >1800 | >1800 | >1800 | >1800 |
| Microcracks in element | none | none | none | none | slight | many |

TABLE 2

|  | Comparative Example 2 | Example 6 | Example 7 | Example 8 | Example 9 | Example 10 |
|---|---|---|---|---|---|---|
| wS (μm) | 12000 | 12000 | 12000 | 12000 | 12000 | 12000 |
| w1 + w2 (μm) | 0 | 20 | 40 | 85 | 600 | 1000 |
| X (%) | 0 | 1.67 | 0.33 | 0.71 | 5.00 | 8.33 |
| Power Cycle (the number of cycles resulting in peeling) | 20k | 50k | 150k | >200k | >200k | 150k |
| Heat Cycle (the number of cycles resulting in peeling) | 0-50 | 0-350 | 300-1000 | >1800 | >1800 | 500-1200 |
| Microcracks in element | none | none | none | none | slight | many | the power cycle test and 1.8 k cycles in the heat cycle test, which are considered as practical values of durability, were obtained.

In Example 9 having a coverage factor X of 5%, slight microcracks were produced at the ends of each semiconductor element in the blade dicing step, and in Example 10 having a coverage factor X of 8.33%, many microcracks were produced. From a practical viewpoint, the upper limit of coverage factor X was determined to be 5%.

The above results revealed that coverage factor X should have a lower limit of 0.76% and an upper limit of 5%.

REFERENCE SIGNS LIST

1 main electrode 1; 2 insulating resin layer 2; 3 substrate surface 3; 7 stress relaxation resin layer 7; S semiconductor substrate S; PD semiconductor element; 104 bonding material; 110 heat spreader; 111 insulating sheet; 112, 113 lead member.

The invention claimed is:

1. A method of manufacturing a semiconductor device, comprising:
    forming a plurality of semiconductor elements for power control on a semiconductor substrate;
    forming a resin layer covering said semiconductor substrate in a crossing region where band-shaped dicing areas dividing said semiconductor elements adjacent to each other cross perpendicularly, the resin layer excluding coverage of electrodes of the semiconductor elements:
    performing dicing in said crossing region to cut said resin layer;
    performing dicing in said dicing areas between said resin layers;
    interconnecting said semiconductor elements separated by dicing; and
    sealing said semiconductor elements as interconnected with a thermosetting resin.

2. The method of manufacturing a semiconductor device according to claim 1, comprising:
    forming an electrode in each of said plurality of semiconductor elements before dicing; and
    forming the resin layer on an outer peripheral part adjacent to said electrode and said crossing region, wherein a pattern of the resin layer covering said outer peripheral part and said crossing region is formed.

3. The method of manufacturing a semiconductor device according to claim 1, wherein the semiconductor substrate is a wafer of silicon carbide.

4. The method of manufacturing a semiconductor device according to claim 1, wherein said semiconductor element that is separated by dicing includes:
    a main electrode formed on a surface of said semiconductor element, and
    an insulating resin layer covering an outer peripheral part of said main electrode,
    in said semiconductor element that is separated by dicing, said resin layer is a stress relaxation resin layer unevenly distributed at four corners of the surface of said semiconductor element to cover outer peripheral edges of said four corners,
    said thermosetting resin seals said semiconductor element as interconnected and said stress relaxation layer, and
    said stress relaxation resin layer is a continuous resin layer of an identical material to said insulating resin layer.

5. A semiconductor device comprising:
    a semiconductor chip diced into quadrangle from a flat plate-like silicon carbide semiconductor substrate;
    a stress relaxation resin layer unevenly distributed at the four corners of a surface of said semiconductor chip to cover outer peripheral edges of said four corners excluding a main electrode thereof: and
    a thermosetting resin sealing said semiconductor chip and said stress relaxation resin layer.

6. The semiconductor device according to claim 5, wherein a length of the stress relaxation resin layer occupying each side of the semiconductor chip diced with a blade is more than or equal to 0.73% and smaller than or equal to 5% of the length of each side.

7. The semiconductor device according to claim 5, wherein the semiconductor chip includes
    the main electrode formed on the surface of said semiconductor chip, and
    an insulating resin layer covering an outer peripheral part of said main electrode, and
    the stress relaxation resin layer is a continuous resin layer of an identical material to said insulating resin layer.

* * * * *